US006933230B2

(12) United States Patent
Dubin

(10) Patent No.: US 6,933,230 B2
(45) Date of Patent: Aug. 23, 2005

(54) METHOD FOR MAKING INTERCONNECTS AND DIFFUSION BARRIERS IN INTEGRATED CIRCUITS

(75) Inventor: Valery Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/093,898

(22) Filed: Mar. 8, 2002

(65) Prior Publication Data
US 2002/0094673 A1 Jul. 18, 2002

Related U.S. Application Data

(62) Division of application No. 09/224,941, filed on Dec. 31, 1998, now Pat. No. 6,359,328.

(51) Int. Cl.[7] .............................................. H01L 21/44
(52) U.S. Cl. ....................... 438/660; 438/663; 438/668; 438/674; 438/675
(58) Field of Search ................................ 438/641, 658, 438/660, 663, 668, 674, 678, 675

(56) References Cited

U.S. PATENT DOCUMENTS

| 2,842,438 A | 7/1958 | Saarivirta, et al. ............ 75/153 |
| 3,954,570 A | 5/1976 | Shirk et al. .................... 204/15 |
| 4,322,457 A * | 3/1982 | Baron et al. ................. 427/259 |
| 4,386,116 A | 5/1983 | Nair et al. ..................... 427/99 |
| 4,788,082 A | 11/1988 | Schmitt ................... 427/248.1 |
| 4,931,410 A | 6/1990 | Tokunaga et al. ........... 437/189 |
| 4,962,058 A | 10/1990 | Cronin et al. ................ 437/187 |
| 5,100,499 A | 3/1992 | Douglas ...................... 156/635 |
| 5,158,986 A | 10/1992 | Cha et al. ...................... 521/82 |
| 5,173,442 A | 12/1992 | Carey ......................... 437/173 |
| 5,240,878 A | 8/1993 | Fitzsimmons et al. ...... 437/187 |
| 5,256,205 A | 10/1993 | Schmitt, III et al. ......... 118/723 |
| 5,308,796 A * | 5/1994 | Feldman et al. ............... 427/98 |
| 5,334,356 A | 8/1994 | Baldwin et al. ............. 422/133 |
| 5,432,128 A * | 7/1995 | Tsu ............................. 438/635 |
| 5,470,789 A | 11/1995 | Misawa ...................... 437/190 |
| 5,470,801 A | 11/1995 | Kapoor et al. .............. 437/238 |

(Continued)

FOREIGN PATENT DOCUMENTS

| JP | 63089040 A * | 4/1988 | .......... H02K/13/00 |
| JP | 3244126 | 10/1991 | ................. 438/678 |
| JP | 03244126 A * | 10/1991 | ....... H01L/21/3205 |

OTHER PUBLICATIONS

Paunovic et al., "Electrochemically deposited diffusion barriers," J. Electrochem. Soc., vol. 141, pp. 1843–50. Jul. 1994.*

(Continued)

Primary Examiner—Paul E. Brock, II
(74) Attorney, Agent, or Firm—Schwegman, Lundberg, Woessner & Kluth, P.A.

(57) ABSTRACT

The inventor devised methods of forming interconnects that result in conductive structures with fewer voids and thus reduced electrical resistance. One embodiment of the method starts with an insulative layer having holes and trenches, fills the holes using a selective electroless deposition, and fills the trenches using a blanket deposition. Another embodiment of this method adds an anti-bonding material, such as a surfactant, to the metal before the electroless deposition, and removes at least some the surfactant after the deposition to form a gap between the deposited metal and interior sidewalls of the holes and trenches. The gap serves as a diffusion barrier. Another embodiments leaves the surfactant in place to serve as a diffusion barrier. These and other embodiments ultimately facilitate the speed, efficiency, or fabrication of integrated circuits.

6 Claims, 2 Drawing Sheets

U.S. PATENT DOCUMENTS

| | | | | |
|---|---|---|---|---|
| 5,506,449 | A | | 4/1996 | Nakano et al. ............. 257/758 |
| 5,635,253 | A | | 6/1997 | Canaperi et al. ............ 427/437 |
| 5,659,193 | A | | 8/1997 | Ishigaki ...................... 257/370 |
| 5,674,787 | A | | 10/1997 | Zhao et al. ................. 437/230 |
| 5,679,608 | A | | 10/1997 | Cheung et al. ............. 437/195 |
| 5,681,441 | A | | 10/1997 | Svendsen et al. ........... 205/114 |
| 5,695,810 | A | | 12/1997 | Dubin et al. .................. 427/96 |
| 5,717,236 | A | | 2/1998 | Shinkawata ................. 257/306 |
| 5,747,881 | A | * | 5/1998 | Hosomi et al. ............. 257/762 |
| 5,785,570 | A | | 7/1998 | Bruni .......................... 445/52 |
| 5,866,920 | A | * | 2/1999 | Matsumoto et al. .......... 257/63 |
| 5,891,513 | A | * | 4/1999 | Dubin et al. ................ 427/305 |
| 5,913,147 | A | | 6/1999 | Dubin et al. ................ 438/687 |
| 5,982,040 | A | | 11/1999 | Yamada et al. ............. 257/776 |
| 6,090,710 | A | * | 7/2000 | Andricacos et al. ........ 438/687 |
| 6,107,657 | A | | 8/2000 | Arita et al. ................. 257/295 |
| 6,181,012 | B1 | * | 1/2001 | Edelstein et al. ........... 257/762 |
| 6,387,805 | B2 | * | 5/2002 | Ding et al. ................. 438/629 |

OTHER PUBLICATIONS

In: *Kirk–Othmer Concise Encyclopedia of Chemical Technology*, Grayson, M., (ed.), John Wiley & Sons, Inc., New York, NY, p. 433–435, 926–938, (1985).

In: *Metals Handbook, 8th Edition, vol. 8*, ASM Handbook Committee, (eds.), American Society for Metals, Materials Park, OH, p. 300–302.

In: *Metals Handbook, Ninth Edition, vol. 2*, Properties and Selection: Nonferrous Alloys and Pure Metals, ASM Handbook Committee, (eds.), American Society for Metals, Metals Park, OH, 157, 395, (1989).

Abe, K., et al., "Sub–half Micron Copper Interconnects Using Reflow of Sputtered Copper Films", *VLSI Multilevel Interconection Conference*, 308–311, (Jun. 25–27, 1995).

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract, 1 p., (Jul. 10, 1988).

Anonymous, "Improved Metallurgy for Wiring Very Large Scale Integrated Circuits", *International Technology Disclosures, 4*, Abstract, 1 page, (1986).

Bai, G., et al., "Copper Interconnection Deposition Techniques and Integration", *1996 Symposium on VSLI Technology*, Digest of Technical Papers, 48–49, (1996).

Braud, E., et al., "Ultra Thin Diffusion Barriers for Cu Interconnections at The Gigabit Generation and Beyond", *VMIC Conference Proceedings*, pp. 174–179, (1996).

Craig, J.D., "Polymide Coatings", *In: Packaging, Electronic Materials Handbook, vol. 1*, ASM International Handbook Committee (eds.), ASM International, Materials Park, OH, 767–772, (1989).

Ding, et al., "Copper Barrier, Seed Layer and Planerization Technologies", *VMIC Conference Proceedings*, pp. 87–92, (1997).

Ernst, et al., "Growth Model for Metal Films on Oxide Surface: Cu on ZnO (0001)–0", *Physical Review B, 47*, 13782–13796, (May 15, 1993).

Godbey, D.J., et al., "Copper Diffusion in Organic Polymer Resists and Inter–level Dielectrics", *Thin Solid Films, 308–309*, pp. 470–474, (1997).

Hirao, S., et al., "A Novel Copper Reflow Process Using Dual Wetting Layers", *Symposium on VLSI Technology*, Digest of Technical Papers, 57–58, (1997).

Iijima, T., et al., "Microstructure and Electrical Properties of Amorphous W–Si–N Barrier Layer for Cu Interconnections", *1996 VMIC Conference*, pp. 168–173, (1996).

Izaki, M., et al., "Characterization of Transparent Zinc Oxide Films Prepared by Electrochemical Reaction", *Journal of the Electrochemical Society, 144*, 1949–1952, (Jun. 1997).

Jayaraj, K., et al., "Low Dielectric Constant Microcellular Foams", *Proceedings from the Seventh Meeting of the DuPont Symposium on Polymides in Microelectrics*, pp. 474–501, (Sep. 1996).

Jin, C., et al., "Porous Xerogel Films as Ultra–low Permittivity Dielectrics for ULSI Interconnect Applications", *Conference Proceedings ULSI XII—1997 Materials Research Society*, pp. 463–469, (1997).

Kang, H.K., et al., "Grain Structure and Electromigration Properties of CVD CU Metallization", *Proceedings of the 10th International VLSI Multilevel Interconnection Conference*, 223–229, (Jun. 8–9, 1993).

Laursen, T., et al., "Encapsulation of Copper by Nitridation of Cu–Ti Alloy/Bilayer Structures", *International Conference on Metallurgical Coatings and Thin Films*, Abstract No. H1.03, San Diego, CA, p. 309, (Apr. 1997).

Miller, R.D., et al., "Low Dielectric Constant Polyimides and Polyimide Nanofoams", *Seventh Meeting of the DuPont Symposium on Polymides in Microelectronics*, pp. 443–473, (Sep. 1996).

Miyake, T., et al., "Atomic Hydrogen Enhanced Reflow of Copper", *Applied Physics Letters, 70*, 1239–1241, (1997).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE, 2335*, pp. 80–90, (1994).

Park, C.W., et al., "Activation Energy for Electromigration in Cu Films", *Applied Physics Letters, 59*(, 175–177, (Jul. 6, 1991).

Ramos, T., et al., "Nanoporous Silica for Dielectric Constant Less Than 2", *Conference Proceedings ULSI XII—1997 Materials Research Society*, 455–461, (1997).

Rossnagel, S.M., "Magnetron Sputter Deposition of Interconnect Applications", *Conference Proceedings, ULSI XI*, 227–232, (1996).

Saarivirta, M.J., "High Conductivity Copper Rich Cu–Zr Alloys", *Transactions of the Metallurgical Society of AIME, 218*, pp. 431–437, (1960).

Shacham–Diamand, Y., "100 nm Wide Copper Lines Made by Selective Electroless Deposition", *Journal of Micromechanics and Microengineering, 1*, 66–72, (Mar. 1991).

Srivatsa, A.R., et al., "Jet Vapor Deposition: an Alternative to Electrodeposition", *Surface Engineering, 11*, 75–77, (1995).

Tao, J., et al., "Electromigration Characteristics of Copper Interconnects", *IEEE Electron Devices Letters, 14*, 249–251, (May 1993).

Ting, C.H., "Methods and Needs for Low K Material Research", *Materials Research Society Symposium Proceedings, vol. 381*, Low–Dielectric Constant Materials—Synthesis and Applications in Microelectronics, Lu, T.M., et al., (eds.), San Francisco, CA, 3–17, (Apr. 17–19, 1995).

Van Vlack, L.H., *Elements of Materials Science*, Addison–Wesley Publishing Co., Inc. Reading, MA, p. 468, (1959).

Wang, X.W., et al., "Highly Reliable Silicon Nitride Thin Films Made by Jet Vapor Deposition", *Japanese Journal of Applied Physics, 34*, 955–958, (Feb. 1995).

Wolf, S., et al., *Silicon Processing for the VLSI Era, vol. 1—Process Technology*, Lattice Press, Sunset Beach, CA, p. 514–538, (1986).

Van Zant, Peter , "Microchip Fabrication: A Practical Guide to Semiconductor Processing", Third Edition, McGraw-Hill, Glossary, (1997),587.

* cited by examiner

METHOD FOR MAKING INTERCONNECTS AND DIFFUSION BARRIERS IN INTEGRATED CIRCUITS

This application is a divisional of application U.S. Ser. No. 09/224,941, filed on Dec. 31, 1998, now issued as U.S. Pat. No. 6,359,328, which is incorporated herein by reference.

TECHNICAL FIELD

The present invention concerns methods of fabricating integrated circuits, particularly methods of making integrated-circuit wiring, or interconnects, from metal and methods of inhibiting metal diffusion through insulation.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together to define a specific electric circuit, such as a computer processor.

To interconnect millions of microscopic components, fabricators sometimes use a dual-damascene metallization technique, which takes its name from the ancient Damascan metalworking art of inlaying metal in grooves or channels to form ornamental patterns. The dual-damascene technique entails covering the components with an insulative layer, etching small holes in the insulative layer to expose portions of the components underneath, and etching shallow trenches from hole to hole to define a wiring pattern. Fabricators then execute a single deposition procedure, such as chemical or physical vapor deposition, to blanket the entire insulative layer with a thin sheet of aluminum. Some of this aluminum fills the holes and trenches and the rest lies on the higher surfaces of the insulative layer. The aluminum on these higher surfaces is then polished or scraped off, leaving behind aluminum vias, or contact plugs, in the holes and thin aluminum wires in the trenches. The wires are typically about one micron thick, or about 100 times thinner than a human hair.

This dual-damascene technique suffers from at least two problems. The first problem is that it uses a single-deposition procedure, which works fairly well for depositing aluminum into wide and shallow holes and trenches, but it is much less effective for narrow and deep ones, particularly those having width-to-depth, or aspect, ratios greater than five. For these aspect ratios, the single-deposition procedure using chemical or physical vapor deposition yields contact plugs and wires that have voids or cavities dispersed throughout and thus increased electrical resistance. Increased electrical resistance wastes power and slows down the transfer of electrical signals through an integrated circuit.

Fabricators have tried to solve this cavity problem, particularly for copper, using "reflow" techniques which entail depositing copper using standard cavity-prone methods and then heating the copper near its melting point. Melting the copper causes it to consolidate and thus eliminates cavities. (See S. Hirao et al, "A Novel Copper Reflow Process Using Dual Wetting Layers," Symposium on VLSI Technology, Digest of Technical Papers, pp. 57–58 (1997)). However, these "reflow" techniques preclude the use of certain materials having melting points lower than that of the deposited metal. This is particularly true for some low-melting-point insulators which would improve integrated-circuit speed and efficiency.

The second problem with the conventional dual-damascene technique is its incompatibility with metals, such as gold, silver, and copper. These metals are more desirable than aluminum because their lower electrical resistance enhances efficiency and speed of integrated circuits and their higher electromigration resistance offers superior reliability. The incompatibility stems from how easy these metals diffuse through silicon-dioxide insulation and thus form short circuits with neighboring wires. Although the diffusion can be prevented by cladding the contact plugs and wires in diffusion barriers, conventional dual-damascene techniques require extra deposition steps to form the barriers. These extra depositions are not only time-consuming but also increase the cost of fabrication.

Accordingly, there is a need for better methods of making contact plugs and wiring, especially methods of making high-aspect-ratio contact plugs and wiring from metals, such as gold, silver, and copper, and more efficient methods of making diffusion barriers.

SUMMARY OF THE INVENTION

To address these and other needs, the inventor devised a new dual-damascene method and a new method of making diffusion barriers for gold, silver, copper, and other metals. Specifically, one embodiment of the new dual-damascene method divides the single-deposition step of conventional dual-damascene techniques into two depositions: a selective electroless deposition for forming vias, or contact plugs with fewer voids, and a conventional deposition process, such as chemical or physical vapor deposition, to fill trenches. Other embodiments fill the trenches using an electroless deposition after forming barrier or seed layers in the trenches using chemical or physical vapor deposition.

One embodiment of the new method of making diffusion barriers entails adding a surfactant to a metal, depositing the metal on an insulative structure, and then removing at least some of the surfactant to form a gap, which serves as a diffusion barrier, between the deposited metal and the insulative structure. Another embodiment of this method leaves the surfactant in place to serve as a diffusion barrier.

DETAILED DESCRIPTION OF PREFERRED EMBODIMENTS

The following detailed description, which references and incorporates FIGS. 1–5, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
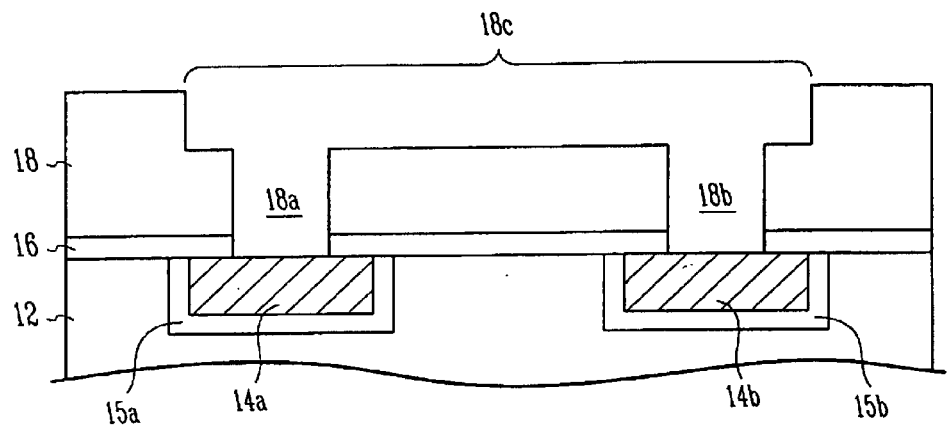
FIG. 1 is a cross-sectional view of an integrated circuit 10 at an early fabrication stage, including a substrate 12, conductors 14a and 14b, diffusion barriers 15a and 15b, a passivation layer 16, holes 18a and 18b, and a trench 18c.

FIGS. 1–5 show a number of exemplary integrated-circuit assemblies, which taken collectively and sequentially, illustrate an exemplary method of the present invention. The method, as shown in FIG. 1, a cross-sectional view, begins with an integrated-circuit assembly or structure 10, which can be part any integrated circuit, a computer processor, for example. Assembly 10 includes a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

Substrate 12 supports conductors 14a and 14b, which are electrically connected to two or more corresponding transistors or other integrated devices (not shown). FIG. 1 also shows that conductors 14a and 14b, which comprise copper, silver, or gold in this exemplary embodiment, are clad in respective diffusion barriers 15a and 15b. The diffusion barriers are made of zirconium, titanium, tantalum, tantalum nitride, tungsten nitride, or hafnium, for example. Other embodiments form conductors 14a and 14b from other metals, for example, aluminum, which are less prone to diffusion than copper, silver, or gold, or form diffusion barriers 15a and 15b from other diffusion-barrier materials, such as TaN/Ta, TaSiN, TiN, Ti/TiN, TiSiN, and WSiN. Thus, the invention is not limited to any particular metal or class of metals, nor to any particular diffusion-barrier materials.

Conductors 14a and 14b are covered by a 10-to-500 nanometer-thick, passivation layer 16, which, for example, comprises silicon nitride, silicon oxynitride, or silicon oxide. Atop passivation layer 16 is an insulative layer 18, sometimes termed an interlayer dielectric or ILD for short. Insulative layer 18 has a nominal thickness of one micron and comprises an organic or inorganic insulative material composition. Examples of suitable insulative materials include silicon oxides, such as silicon dioxide, and polymeric materials, such as polyimides. Moreover, some embodiments form insulative layer 18 from materials such as BCB™ and FLARE™, which are inherent diffusion barriers. (These embodiments omit remaining portions of the exemplary methods that relate specifically to inhibiting diffusion.) Thus, the invention is not limited any particular insulators or types of insulators.

Layer 18 includes holes 18a and 18b and a trench 18c which connects the holes, according to conventional dual-damascene techniques. Holes 18a and 18b have an aspect ratio, that is, height-to-width ratio, greater than five, for example 5.5, 6.0, 6.5, 7.0, 7.5, and so forth. More precisely, holes 18a and 18b have a diameter of about 50, 60, 70, . . . , or 150 nanometers and a height (depth) of about 250, 350, 450, . . . , or 1050 nanometers. In addition, holes 18a and 18b expose at least a portion of respective conductors 14a and 14b. Trench 18c, in the exemplary embodiment, has an aspect ratio ranging approximately between two and four, with an approximate width of 0.15, 0.20, 0.30, 0.40, 0.5, 0.6, 0.7, 0.80, 0.90, or 1.0 microns. However, other embodiments use trenches with aspect ratios greater than five, for example 5.5, 6.0, 6.5, 7.0, 7.5, and so forth.

Figure 2:
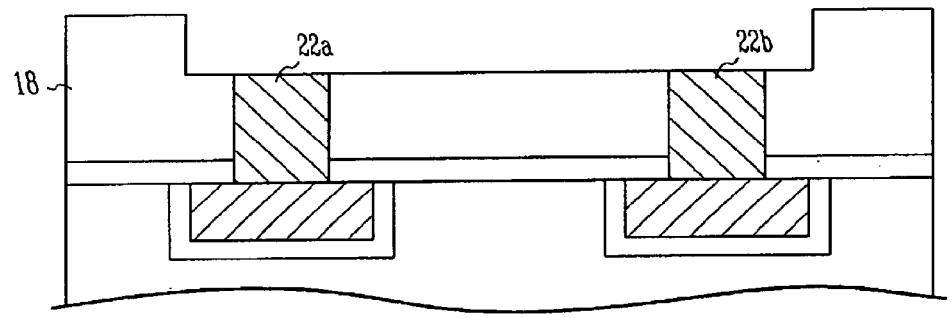
FIG. 2 is a cross-sectional view of the FIG. 1 integrated circuit after at least partly filling holes 18a and 18b with a conductive material to form contact plugs 22a and 22b.

FIG. 2 shows that the exemplary method entails forming contact plugs 22a and 22b in corresponding holes 18a and 18b. Forming the contact plugs entails using an electroless metal deposition to deposit metal in the holes, filling them from the bottom up to approximately the lowest level of trench 18c. (As used herein, electroless deposition includes any autocatalytic deposition of a film through the interaction of a metal salt and a chemical reducing agent.) During the electroless deposition, the exposed portions of conductors 14a and 14b serve as seed areas or regions which control placement of the deposited metal. In contrast, conventional techniques of chemical and physical vapor deposition allow deposited metal atoms to stick to sidewalls of holes and trenches and then to each other, eventually building bridges, or closures, across the holes and trenches and ultimately leaving voids, or wormholes, in the resulting structure. The exemplary technique generally avoids this limitation. Moreover, because of the inherent selectivity of the deposition, this exemplary technique allows the formation of unlanded contact plugs, that is, plugs that are offset from the underlying conductor. Ultimately, this permits use of lower precision, and thus generally lower cost, fabrication equipment.

Additionally, because the exemplary technique avoids the formation of cavities, there is no need to resort to corrective procedures, such as reflow, which entail heating the deposited metal to its melting point to eliminate cavities. As a consequence, the exemplary technique is not limited to insulative materials with high melting points. Indeed, some embodiments of the invention exercise the exemplary technique with low-dielectric-constant insulators (k<3), such as CVD F—$SiO_2$, porous oxides, organic polymers, aerogels, and nanofoams. These materials, which have previously not been paired with gold, silver, copper (particularly in dual-damascene structures) because of the need to reflow these metals, generally enhance the speed and efficiency of integrated circuits.

More specifically, the exemplary electroless deposition procedure deposits a gold, silver, or copper alloy in composition with an anti-bonding material, such as one or more surfactants, that prevents chemical bonding of the alloy to the material of insulative layer 18. As used herein, the term surfactant includes materials or material compositions exhibiting one or more of the following functional properties or characteristics: cleaning (detergency), foaming, wetting, emulsifying, solubilizing, and dispersing. The term also include materials that, when in a liquid state, have a higher concentration at the surface than within the bulk of the liquid.

Although the invention is not limited to any particular genus or species of surfactant, the exemplary embodiment uses polyethyleneglycol, RE 610™, or TRITON X-100.™ (Triton X-100 is supplied by Aldrich.) Various embodiments of the invention use one or more of the following types of surfactants:

cationics—surfactants which exhibit adsorption on surfaces and have a surface active group named after the parent nitrogen, phosphorous, or sulfur starting materials, for example, dodecyl methylpolyoxyethylene ammonium chloride;

anionics—surfactants which exhibit adsorption on polar surfaces and have a surface active part of the molecule has a negative charge, for example, detergents, carboxylates, isethionates, taurates, phosphates, sarcosinates, sulphates, sulphonates, sulphosuccinates, and sulphosuccinamates;

non-ionics—surfactants which lack a charge group, for example, surfactants having the hydroxyl group (R—OH), the ether group (R—O—R) or oxide group (amine oxide); and amphoterics—surfactants in which the surface active group can have a positive, negative, or mixed charged depending on particular conditions, for example, N-alkyl aminopropionates, N-alkyl betaines, and carboxy glycinates.

One or more of these surfactants are incorporated into the electroless deposition (or plating) solution before beginning the deposition.

The exemplary embodiment adds enough surfactant, several milligrams per liter of solution, to form a mono-layer between the deposited metal and the walls of the holes. Other embodiments use surfactant concentrations ranging approximately from 3 milligrams per liter to 10 grams per liter. In selecting the appropriate amount of surfactant, one should consider that greater surfactant concentrations will generally result in greater increases in the electrical resistance of the deposited metal. Whether the increase is acceptable will ultimately depend on particular performance objectives. However, in general, the amount of surfactant should be minimized.

Other embodiments of the invention omit the anti-bonding material from the metal and deposit gold, silver, or copper with one or more alloying elements such as Sn, Mg, Ni, Zn, Pd, Au, Re, Zr and W, which, when annealed, form a self-passivation layer on the sidewalls of contact plugs 22$a$ and 22$b$. More precisely, during annealing, these alloying elements migrate toward the metal-insulator interface of contact plugs 22$a$ and 22$b$ and holes 18$a$ and 18$b$, forming a barrier layer which inhibits migration or diffusion of metal atoms into insulative layer 18. Thus, alloys containing sufficient quantities of these and functionally equivalent alloy elements require no extra deposition procedures to inhibit diffusion into surrounding insulative structures. To avoid increasing resistivity of the alloy above four micro-ohms per centimeter (the resistivity of conventional aluminum-copper alloys used in integrated circuits), the exemplary embodiment adds one or more of these alloy elements to make up approximately 0.01 to 5.0 percent of the resulting alloy.

Figure 3:
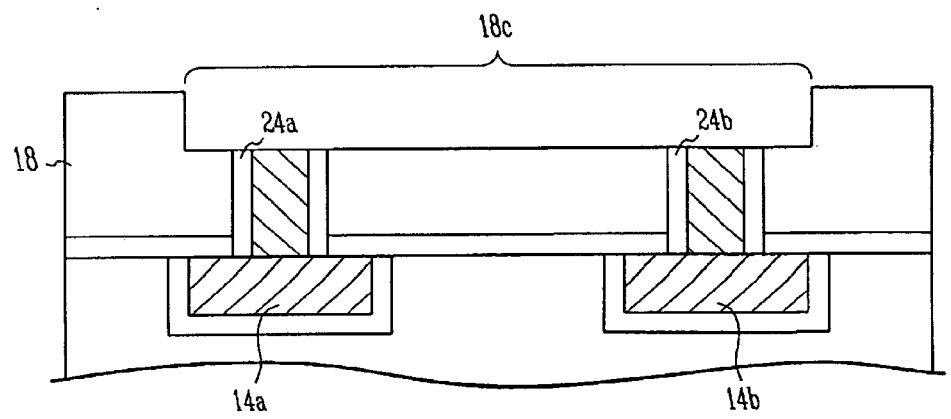
FIG. 3 is a cross-sectional view of the FIG. 2 integrated circuit, after forming respective gaps 24a and 24b between contact plugs 22a and 22b and the interior sidewalls of holes 18a and 18b, for example by removing a surfactant from the conductive material constituting contact plugs 22a and 22b.
Figure 4:
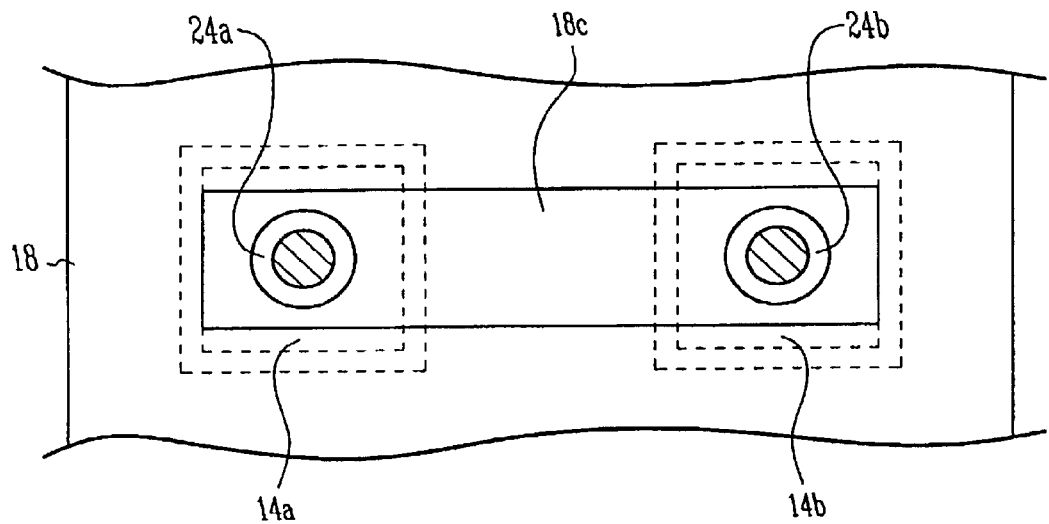
FIG. 4 is a top view of the FIG. 3 integrated circuit illustrating that respective gaps 24a and 24b, in this exemplary embodiment, form "air cylinders" around respective contact plugs 22a and 22b.

FIG. 3 shows that after forming the contact plugs, the exemplary method optionally removes the anti-bonding material from the contact plugs to form gaps 24$a$ and 24$b$ between plugs 22$a$ and 22$b$ and the interior sidewalls of holes 18$a$ and 18$b$. These gaps are several angstroms wide in the exemplary embodiment and inhibit diffusion of material from plugs 22$a$ and 22$b$ into the interior sidewalls of holes 18$a$ and 18$b$. FIG. 4 shows that gaps 24$a$ and 24$b$, in this exemplary embodiment, define respective cylindrical air cavities or "air tubes" around plugs 22$a$ and 22$b$. Alternatively, one can view these as "air barriers" or "barrier tubes."

In the exemplary embodiment, removing the anti-bonding material added to the metal-plating solution before filling holes 18$a$ and 18$b$ entails annealing the assembly at a temperature of 100–500° C. for about 0.1–4.0 hours. Annealing the assembly expels substantially all of the surfactant and leaves a gap about 1–20 angstroms wide, depending on quantity and type of anti-bonding materials and specifics of the annealing procedure. Other embodiments of the invention omit the removal procedure since the surfactant soaks, or adsorbs, into the interior sidewalls of holes 18$a$ and 18$b$, forming an effective diffusion barrier.

Figure 5:
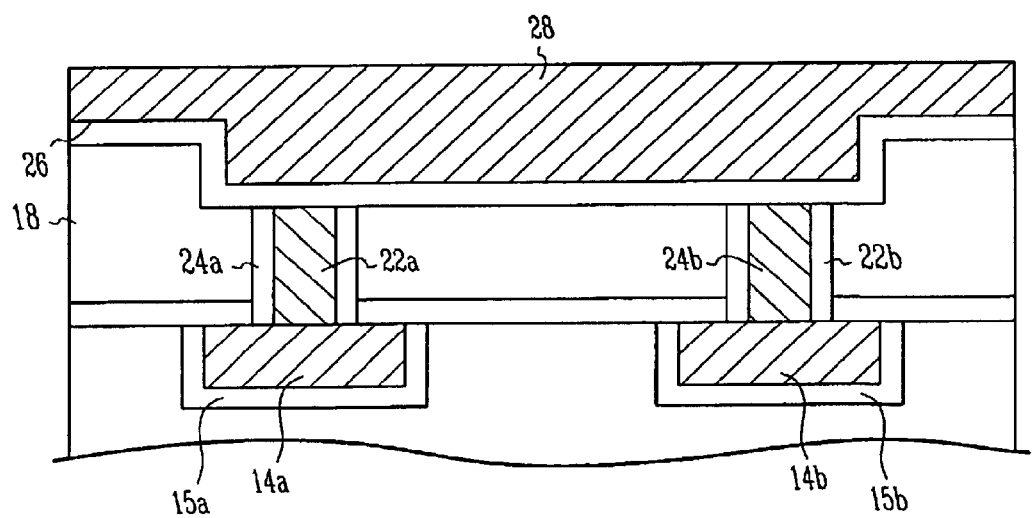
FIG. 5 is a cross-sectional view of the FIG. 3 integrated circuit after formation of a diffusion barrier 26 and a conductive layer 28 within trench 18c.

FIG. 5 shows that after forming plugs 22$a$ and 22$b$ and optionally removing any anti-bonding material from them, the exemplary method forms a diffusion-barrier layer 26 and a conductive layer 28 within trench 18$c$, thereby electrically connecting contact plugs 22$a$ and 22$b$. Although the invention is not limited to any specific method of forming layers 26 and 28, the exemplary method uses a chemical or physical deposition, electroless deposition, or selective chemical-vapor deposition, or electroplating.

Moreover, some embodiments omit barrier layer 26 and form conductive layer 28 using a process similar to that for making contact plugs 22$a$ and 22$b$ and diffusion barriers gaps 24$a$ and 24$b$. In brief, this entails depositing metal containing an anti-bonding material and optionally removing at least some of the anti-bonding material to form air gaps between conductive layer 28 and insulative layer 18. Formation of these air gaps will likely reduce the effective dielectric constant of the interconnection and thus enhance speed and efficiency of the resulting integrated circuit.

CONCLUSION

In furtherance of the art, the inventor has devised and presented new methods of making integrated-circuit wiring systems, new methods of making diffusion barriers, and new interconnective structures. Various embodiments of the invention ultimately facilitate fabrication of integrated circuits, such as computer processors and integrated memories, with superior speed and efficiency.

More particularly, the exemplary embodiment of the new method applies a selective electroless deposition to form the contact plugs and a selective or non-selective deposition to fill trenches. The exemplary method of making a diffusion barrier entails adding an anti-bonding material, such as a surfactant, to a metal, forming a structure containing the metal in insulation, and optionally removing at least a portion of the anti-bonding material.

The embodiments described above are intended only to illustrate and teach one or more ways of practicing or implementing the present invention, not to restrict its breadth or scope. The actual scope of the invention, which encompasses all ways of practicing or implementing the concepts of the invention, is defined only by the following claims and their equivalents.

What is claimed is:

1. A method of forming one or more conductive structures for an integrated circuit, the method comprising:

providing a solution including at least one surfactant and at least one metal, with the solution having a surfactant concentration; and forming an insulative structure having at least one hole and at least one trench, with the at least one hole having a sidewall portion;

depositing the at least one metal and the at least one surfactant from the solution into the at least one hole;

removing at least a portion of the at least one surfactant from the at least one hole or the at least one trench to form a diffusion barrier after depositing the at least one metal and the at least one surfactant; and depositing metal in the at least one trench after removing at least a portion of the at least one surfactant.

2. The method of claim 1 wherein one surfactant comprises one or more cationic, anionic, non-ionic, or amphoteric surfactants.

3. The method of claim 2 wherein the at least one metal comprises gold, silver, or copper.

4. The method of claim 1, wherein removing at least a portion of the at least one surfactant comprises heating the deposited metal and the at least one surfactant for a period of time to expel substantially all of the at least one surfactant.

5. The method of claim 1, wherein the surfactant concentration is at least 3 milligrams per liter.

6. The method of claim 1, wherein the insulative structure consist essentially of a material composition having a dielectric constant less than three.

* * * * *

UNITED STATES PATENT AND TRADEMARK OFFICE
CERTIFICATE OF CORRECTION

PATENT NO. : 6,933,230 B2 Page 1 of 1
DATED : August 23, 2005
INVENTOR(S) : Dubin It is certified that error appears in the above-identified patent and that said Letters Patent is hereby corrected as shown below:

<u>Title page, Item [54] and Column 1, line 1</u>,
Title, delete "METHOD" and insert -- METHODS --, therefor.

<u>Column 6</u>,
Line 65, after "wherein" insert -- the at least --.

Signed and Sealed this

Eighth Day of November, 2005

JON W. DUDAS
*Director of the United States Patent and Trademark Office*